United States Patent
Kaklin

(10) Patent No.: US 10,892,757 B1
(45) Date of Patent: Jan. 12, 2021

(54) REVERSE BODY BIASING OF A TRANSISTOR USING A PHOTOVOLTAIC SOURCE

(71) Applicant: STMicroelectronics (Research & Development) Limited, Marlow (GB)

(72) Inventor: Filip Kaklin, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 16/693,672

(22) Filed: Nov. 25, 2019

(51) Int. Cl.
| | | |
|---|---|---|
| H03K 19/00 | (2006.01) | |
| H01L 27/14 | (2006.01) | |
| H03K 19/003 | (2006.01) | |
| H01L 27/144 | (2006.01) | |
| H01L 27/16 | (2006.01) | |
| H01L 27/146 | (2006.01) | |
| H01L 31/02 | (2006.01) | |

(52) U.S. Cl.
CPC ... *H03K 19/00361* (2013.01); *H01L 27/1443* (2013.01); *H01L 27/1446* (2013.01); *H01L 27/14605* (2013.01); *H01L 27/14643* (2013.01); *H01L 27/16* (2013.01); *H01L 31/02005* (2013.01)

(58) Field of Classification Search
CPC ........ H03K 19/00361; H01L 27/14643; H01L 27/14605; H01L 27/16; H01L 31/02005; H01L 27/1446; H01L 27/1443; H01L 27/4614; H01L 27/14609; H01L 27/1461; H01L 27/14612; H04N 5/3745; H04N 5/335; H02J 7/03
See application file for complete search history.

(56) References Cited

U.S. PATENT DOCUMENTS

| | | | |
|---|---|---|---|
| 5,322,994 A | | 6/1994 | Uno |
| 5,583,457 A | * | 12/1996 | Horiguchi ............. G06F 1/3203 326/121 |
| 5,900,623 A | | 5/1999 | Tsang et al. |
| 5,910,738 A | | 6/1999 | Shinohe et al. |
| 6,097,022 A | * | 8/2000 | Merrill ................... H04N 3/155 250/208.1 |
| 6,593,799 B2 | | 7/2003 | De et al. |
| 6,759,873 B2 | | 7/2004 | Kang et al. |
| 6,821,808 B2 | | 11/2004 | Nakamura et al. |
| 6,967,522 B2 | | 11/2005 | Chandrakasan et al. |
| 7,349,018 B2 | | 3/2008 | Doering et al. |

(Continued)

OTHER PUBLICATIONS

Lallement, et al.: "A 2.7pJ/cycle 16MHz SoC with 4.3nW Power-Off ARM Cortex-Mo+ Core in 28nm FD-SOI", SSCIRC 2017, Sep. 2017, Leuven, Belgium (4 pages).

(Continued)

*Primary Examiner* — Vibol Tan
(74) *Attorney, Agent, or Firm* — Crowe & Dunlevy

(57) ABSTRACT

A metal oxide semiconductor (MOS) transistor has a source terminal, a drain terminal, a gate terminal and a body terminal. The source terminal is connected to receive a supply voltage and the body terminal is connected to receive a reverse body bias voltage. A photovoltaic circuit has a first terminal connected to the source terminal of the MOS transistor and a second terminal connected to the body terminal of the MOS transistor. The photovoltaic circuit converts received photons from the environment to generate the reverse body bias voltage.

18 Claims, 4 Drawing Sheets

(56) References Cited

U.S. PATENT DOCUMENTS

| | | |
|---|---|---|
| 8,294,492 B2 | 10/2012 | Bol et al. |
| 8,587,365 B1 | 11/2013 | Raghavan et al. |
| 8,780,101 B2 | 7/2014 | Tsujino et al. |
| 8,816,754 B1 | 8/2014 | Clark et al. |
| 9,112,484 B1 | 8/2015 | Clark et al. |
| 9,112,495 B1 | 8/2015 | Clark et al. |
| 9,166,069 B2* | 10/2015 | Sugizaki ................ H03F 3/082 |
| 9,426,395 B2 | 8/2016 | Jakobson et al. |
| 9,710,006 B2 | 7/2017 | Bolling |
| 9,800,814 B2* | 10/2017 | Jin ...................... H04N 5/3745 |
| 9,854,194 B2 | 12/2017 | Ni |
| 9,979,920 B2* | 5/2018 | Mizuguchi ........... H04N 5/3745 |
| 10,262,985 B2* | 4/2019 | Robins ................ H03K 19/0948 |
| 2006/0223201 A1 | 10/2006 | Liu et al. |
| 2007/0140496 A1* | 6/2007 | Phinney ................ H04L 9/0894 380/286 |
| 2008/0054989 A1 | 3/2008 | Choi et al. |
| 2009/0108905 A1 | 4/2009 | Wang et al. |
| 2009/0237135 A1 | 9/2009 | Ramaraju et al. |
| 2012/0086499 A1 | 4/2012 | Husain et al. |
| 2018/0166901 A1* | 6/2018 | Yu ........................ H02J 7/0068 |
| 2019/0326911 A1 | 10/2019 | Kumar |
| 2020/0081476 A1* | 3/2020 | Lallement ........... H01L 27/0928 |

OTHER PUBLICATIONS

Tschanz, et al.: "Adaptive body bias for reducing impacts of die-to-die and within-die parameter variations on microprocessor frequency and leakage", IEEE Journal of Solid-State Circuits ( vol. 37, Issue: 11, Nov. 2002 ) (pp. 1396-1402).

Quelen, et al.: "A 2.5µW 0.0067mm2automatic back-biasing compensation unit achieving 50% leakage reduction in FDSOI 28nm over 0.35-to-1V VDDrange", 2018 IEEE International Solid—State Circuits Conference—(ISSCC) (3 pages).

* cited by examiner

REVERSE BODY BIASING OF A TRANSISTOR USING A PHOTOVOLTAIC SOURCE

TECHNICAL FIELD

The present invention relates to body biasing of transistors in a digital circuit and, in particular, to the implementation of a reverse body biasing of a digital circuit transistor where the reverse body bias voltage is generated using an energy harvesting source such as a photovoltaic circuit.

BACKGROUND

It is well known in the art to apply a body bias to the well (body) region of a metal oxide semiconductor field effect transistor (MOSFET) in order to influence the properties of the transistor channel. For example, a forward body bias (FBB) applied to the well influences device operation by decreasing the threshold voltage (Vt) of the transistor. This results in a faster operating device due to increase in the channel current at the expense of increased leakage current. Conversely, a reverse body bias (RBB) applied to the well influences device operation by increasing the threshold voltage (Vt) of the transistor. This results in a device which exhibits a lower leakage current at the expense of a reduced speed. It is accordingly clear that circuit designers can use body bias selection to modulate transistor threshold voltage in effectuating a tradeoff between power and speed for the circuit operation.

There is an increased interest in circuits which operate at ultra-low voltage levels. For example, voltage levels equal to or less than 0.5V for digital circuitry are now becoming common in many applications such as with Internet of Things (IoT) oriented devices. It is common for that digital circuitry to operate in a suspended operating mode (such as sleep or deep-sleep), and when in this mode it is important that the transistors of the digital circuitry have a reduced leakage current.

To address this concern, the circuit designer may choose to use a reverse body bias (RBB) applied to the transistor well (body). In these schemes, the body of a p-channel transistor (pMOS) is connected to a voltage source producing a voltage (for example, Vdds) that is larger (i.e., more positive) than the supply voltage (for example, Vdd) at the transistor source, and the body of an n-channel transistor (nMOS) is connected to a voltage source producing a voltage (for example, Gnds) that is smaller (i.e., more negative) than the supply voltage (for example, Gnd) at the transistor source.

As shown in FIG. 1, using the example of a CMOS digital logic inverter gate 10 with pMOS transistor 12 and nMOS transistor 14 coupled in series as the digital circuitry, an n-well bias generator circuit 16 is used to generate the reverse body bias voltage Vdds for application to the well of the pMOS transistor 12 whose source is connected to the supply voltage Vdd (where Vdds>Vdd), and a p-well bias generator circuit 18 is used to generate the reverse body bias voltage Gnds for application to the well of the nMOS transistor 14 whose source is connected to the ground voltage Gnd (where Gnds<Gnd). The n-well bias generator circuit 16 is typically a positive charge pump circuit and the p-well bias generator circuit 18 is typically a negative charge pump circuit. A problem with this implementation is that the charge pump circuits for the bias generator circuits 16 and 18 consume some amount of power overhead from the supply voltage Vdd.

There is a need in the art to address the noted drawbacks of prior art reverse body biasing schemes.

SUMMARY

In an embodiment, a circuit comprises: a metal oxide semiconductor (MOS) transistor having a source terminal, a drain terminal, a gate terminal and a body terminal; wherein the source terminal is connected to receive a supply voltage; and a photovoltaic circuit having a first terminal connected to the source terminal of the MOS transistor and a second terminal connected to the body terminal of the MOS transistor, wherein the photovoltaic circuit converts received photons to generate a reverse body bias voltage applied to the body terminal of the MOS transistor.

In an embodiment, a circuit comprises: a metal oxide semiconductor (MOS) transistor having a source terminal, a drain terminal, a gate terminal and a body terminal; wherein the source terminal is connected to receive a supply voltage; and an energy harvesting circuit having a first terminal connected to the source terminal of the MOS transistor and a second terminal connected to the body terminal of the MOS transistor, wherein the energy harvesting circuit harvests energy to generate a reverse body bias voltage applied to the body terminal of the MOS transistor.

BRIEF DESCRIPTION OF THE DRAWINGS

For a better understanding of the embodiments, reference will now be made by way of example only to the accompanying figures in which.

DETAILED DESCRIPTION

Figure 1:
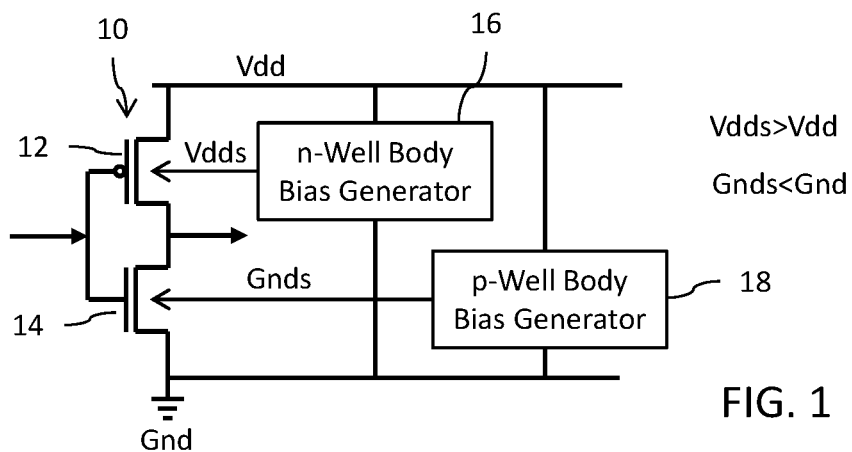
FIG. 1 is a block diagram for a digital circuit with reverse body biasing of transistor wells using charge pump circuits.
Figure 2:
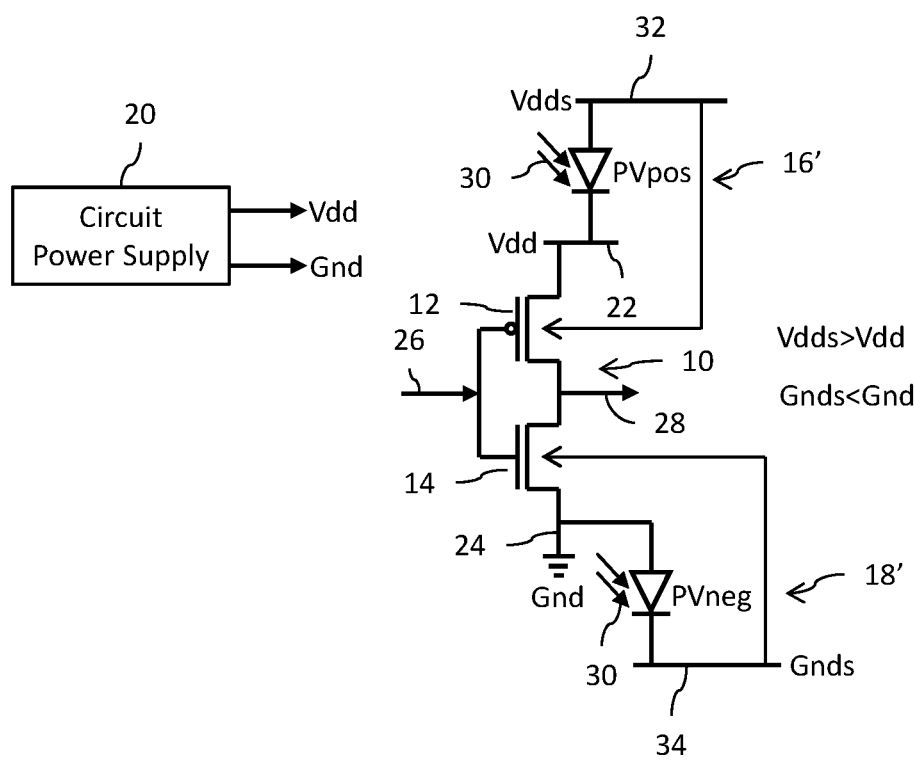
FIG. 2 is a block diagram for a digital circuit with reverse body biasing of transistor wells using photovoltaic circuits.

Reference is now made to FIG. 2 which shows a block diagram for a digital circuit with reverse body biasing (RBB) of transistor wells. The digital circuit is powered by a power supply circuit 20 that is configured to provide a power supply domain with a positive supply voltage Vdd and a ground voltage Gnd. In an ultra-low voltage circuit application, Vdd may be equal to a voltage of 0.5V. The digital circuit is represented here in a simplified form by just a single CMOS digital logic inverter gate 10 comprising a pMOS transistor 12 and an nMOS transistor 14 coupled in series with each other. The source terminal of the pMOS transistor 12 is coupled to a supply node 22 receiving the positive supply voltage Vdd. The source terminal of the nMOS transistor 14 is coupled to a supply node 24 receiving the ground supply voltage Gnd. The gate terminals of the pMOS and nMOS transistors, 12 and 14, are coupled together at a signal input node 26. The drain terminals of the pMOS and nMOS transistors, 12 and 14, are coupled together at a signal output node 28.

An n-well bias generator circuit 16' is used to generate a reverse body bias voltage Vdds (where Vdds>Vdd) for application to the well of the pMOS transistor 12. The n-well bias generator circuit 16' is formed by at least one photovoltaic cell PVpos such as a diode operating in photovoltaic mode to generate a voltage from photons 30 received from the environment. The diode for the photovoltaic cell PVpos has a cathode coupled to the supply node 22 receiving the positive supply voltage Vdd and an anode coupled to a more positive supply node 32 at which the reverse body bias voltage Vdds is generated. This reverse body bias voltage Vdds is applied to the well(s) of the pMOS transistor(s) 12. A p-well bias generator circuit 18' is used to generate a reverse body bias voltage Gnds (where Gnds<Gnd) for application to the well of the nMOS transistor 14. The p-well bias generator circuit 18' is formed by at least one photovoltaic cell PVneg such as a diode operating in photovoltaic mode to generate a voltage from photons 30 received from the environment. The diode for the photovoltaic cell PVneg has an anode coupled to the supply node 24 receiving the ground supply voltage Gnd and a cathode coupled to a more negative supply node 34 at which the reverse body bias voltage Gnds is generated. This reverse body bias voltage Gnds is applied to the well(s) of the nMOS transistor(s) 14.

Figure 3:
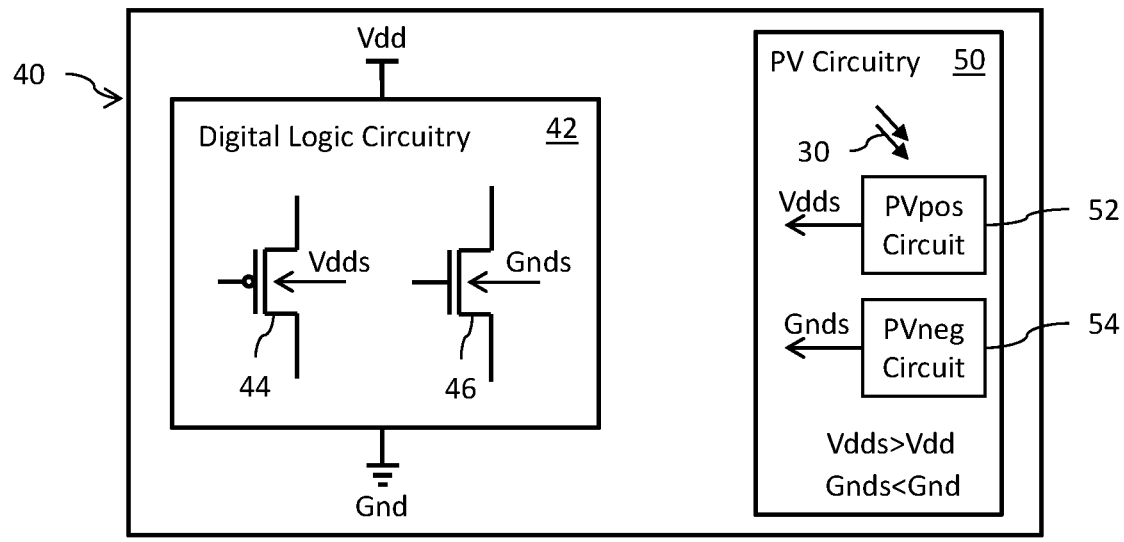
FIG. 3 is a block diagram of an integrated circuit device.

Reference is now made to FIG. 3 which shows a block diagram of an integrated circuit device 40. The integrated circuit device 40 includes digital logic circuitry 42 powered by a power supply domain with a positive supply voltage Vdd and a ground voltage Gnd. The digital logic circuitry 42 includes CMOS digital circuits such as digital logic gates (logical AND, OR, NAND, NOR, etc.) as well as other digital signal handling and processing circuits (such as flip-flops, latches, multiplexers, processors, controllers, etc.). These digital circuits are formed by interconnected pMOS transistors 44 and nMOS transistors 46. The pMOS transistors 44 each include a source terminal, a drain terminal, a gate terminal and a body (well) terminal. The nMOS transistors 46 each include a source terminal, a drain terminal, a gate terminal and a body (well) terminal. The integrated circuit device 40 further includes photovoltaic (PV) circuitry 50 with a positive PV (PVpos) circuit 52 that responds to received photons 30 to generate a reverse body bias voltage Vdds (where Vdds>Vdd) for application to the well(s) of the pMOS transistor(s) 44 within the digital logic circuitry 42. The photovoltaic (PV) circuitry 50 further includes a negative PV (PVneg) circuit 54 that responds to received photons 30 to generate a reverse body bias voltage Gnds (where Gnds<Gnd) for application to the well(s) of the nMOS transistor(s) 46 within the digital logic circuitry 42.

The positive PV circuit 52 may comprise one photovoltaic cell PVpos (see, FIG. 2, reference 16') or a plurality of photovoltaic cells PVpos interconnected with each other (see, FIGS. 8A-8B) between the supply node receiving the positive supply voltage Vdd and the more positive supply node at which the reverse body bias voltage Vdds is generated.

The negative PV circuit 54 may comprise one photovoltaic cell PVneg (see, FIG. 2, reference 18') or a plurality of photovoltaic cells PVneg interconnected with each other (see, FIGS. 8A-8B) between the supply node receiving the ground supply voltage Gnd and the more negative supply node at which the reverse body bias voltage Gnds is generated.

The power supply domain with the positive supply voltage Vdd and the ground voltage Gnd may be provided "off-chip" by a power supply external to the integrated circuit device 40 or provided "on-chip" by a power supply internal to the integrated circuit device 40 (such as a voltage regulator circuit that receives power from an off-chip source).

Figure 4:
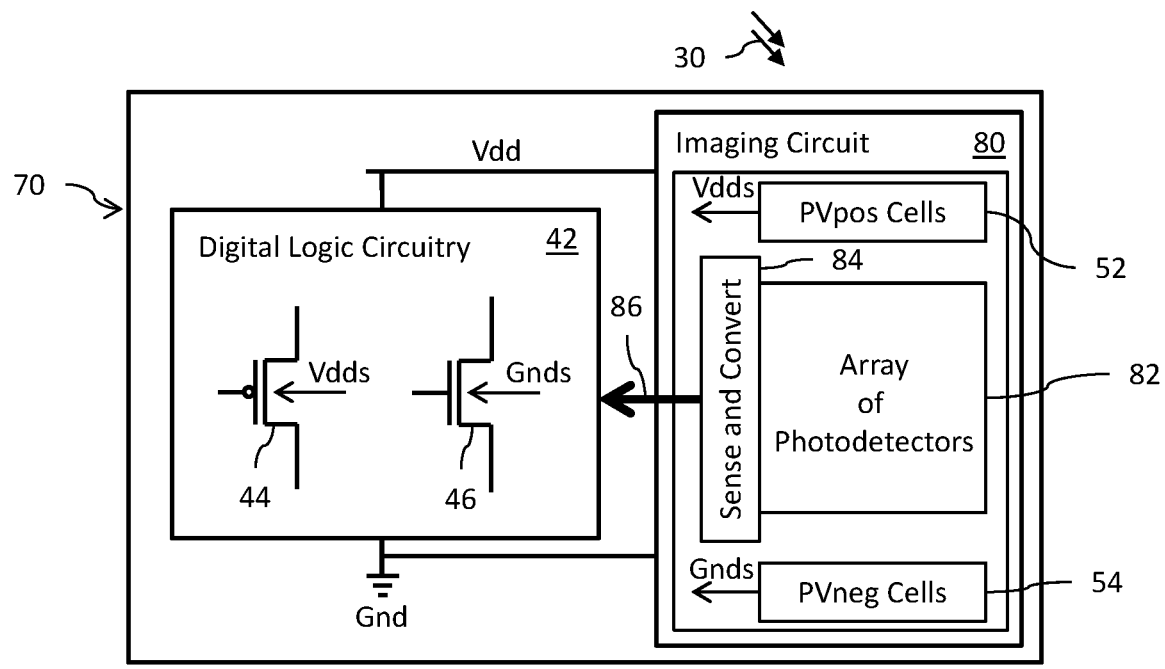
FIG. 4 is a block diagram of an imaging integrated circuit device.

Reference is now made to FIG. 4 which shows a block diagram of an imaging integrated circuit device 70. The integrated circuit device 70 includes digital logic circuitry 42 and an imaging circuit 80 that are powered by a power supply domain with a positive supply voltage Vdd and a ground voltage Gnd. The imaging circuit 80 includes an array 82 of photodetectors (such as photodiodes) for receiving photons 30. A sense and convert circuit 84 senses the signals generated by the photodetectors in the array 82 and performs a conversion to generate digital image signals 86 for processing by the digital logic circuitry 42. The digital logic circuitry 42 includes CMOS digital circuits such as digital logic gates (logical AND, OR, NAND, NOR, etc.) as well as other digital signal handling and processing circuits (such as flip-flops, latches, multiplexers, processors, controllers, etc.). These digital circuits are formed by interconnected pMOS transistors 44 and nMOS transistors 46. The pMOS transistors 44 each include a source terminal, a drain terminal, a gate terminal and a body (well) terminal. The nMOS transistors 46 each include a source terminal, a drain terminal, a gate terminal and a body (well) terminal.

The imaging circuit 80 further includes photovoltaic (PV) circuitry comprising a positive PV (PVpos cells) circuit 52 that responds to received photons 30 to generate a reverse body bias voltage Vdds (where Vdds>Vdd) for application to the well(s) of the pMOS transistor(s) 44 within the digital logic circuitry 42. The photovoltaic (PV) circuitry further includes a negative PV (PVneg cells) circuit 54 that responds to received photons 30 to generate a reverse body bias voltage Gnds (where Gnds<Gnd) for application to the well(s) of the nMOS transistor(s) 46 within the digital logic circuitry 42.

Figure 5:
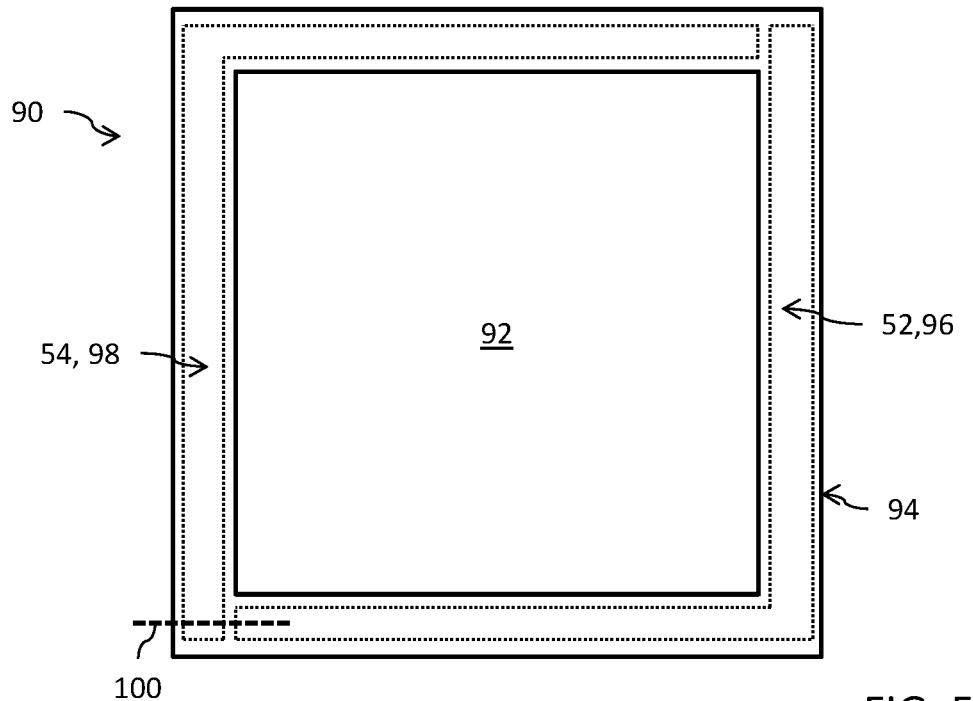
FIG. 5 shows a general layout of an imaging circuit within the imaging integrated circuit device.

FIG. 5 shows a general layout of a light sensitive portion 90 of the imaging circuit 80. The light sensitive portion 90 is formed by an array of pixels, wherein each pixel includes a diode structure. First pixels of the array of pixels are arranged in a sub-array 92 to form the array 82 of photodetectors. Second pixels of the array of pixels are arranged in a ring shape 94 providing a region that surrounds the array of first pixels. A first portion 96 of the second pixels provide the one or more photovoltaic cells PVpos of the positive PV circuit 52 that generates the reverse body bias voltage Vdds>Vdd. A second portion 98 of the second pixels provide the one or more photovoltaic cells PVneg of the negative PV circuit 54 that generates the reverse body bias voltage Gnds<Gnd.

Figure 6:
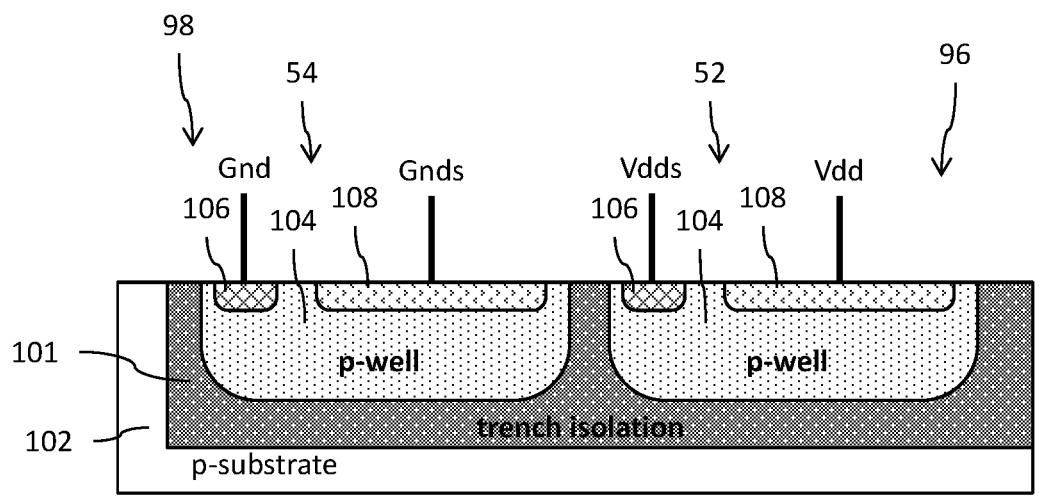
FIG. 6 is a cross-sectional view of pixel photovoltaic cells for the photovoltaic circuits generating reverse body bias voltages.

Reference is now made to FIG. 6 which shows an example cross-section of the light sensitive portion 90, where the cross-section is taken in the ring shape 94 region at the location shown by the dotted line 100 in in FIG. 5. The light sensitive portion 90 is formed in a lightly p-type doped semiconductor substrate 102. In the ring shape 94 region, a deep trench isolation 101 is formed in the semiconductor substrate 102, with this deep trench isolation 101 essentially surrounding the sub-array 92 that provides the array 82 of photodetectors. Each of the second pixels is formed within a p-type doped well 104 that is isolated from other pixels and the substrate 100 by the deep trench isolation 101. The p-type doped well 104 forms the anode of the photovoltaic cell PV. Electrical contact is made to the p-type doped well 104 through a more heavily p-type doped contact region 106. An n-type doped region 108 is implanted in the p-type doped well 104 to form the cathode of the photovoltaic cell PV.

For the second pixels in the first portion 96 of the ring shape 94 region that are part of the positive PV circuit 52, the n-type doped region 108 for the cathode of the photovoltaic cell PVpos is electrically connected to the positive supply voltage Vdd and the p-type doped contact region 106 for the anode of the photovoltaic cell PVpos is electrically connected to supply the reverse body bias voltage Vdds to the well (body) of the pMOS transistors.

For the second pixels in the second portion 98 of the ring shape 94 region that are part of the negative PV circuit 54, the p-type doped contact region 106 for the anode of the photovoltaic cell PVneg is electrically connected to ground voltage Gnd and the n-type doped region 108 for the cathode of the photovoltaic cell PVneg is electrically connected to supply the reverse body bias voltage Gnds to the well (body) of the nMOS transistors.

Figure 7:
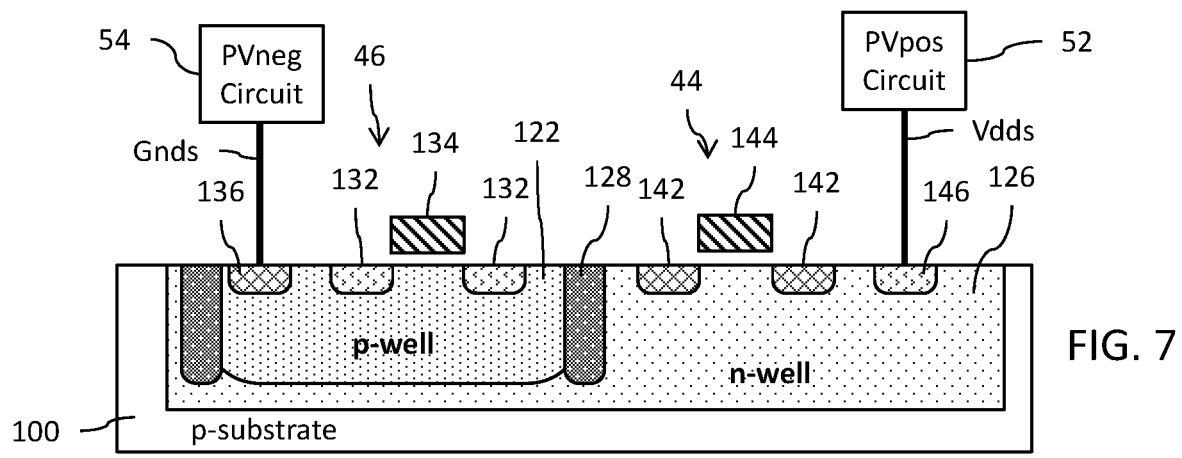
FIG. 7 is a cross-sectional view of nMOS and pMOS transistors of a digital circuit, where bodies of the transistors are reverse body biased.

The nMOS and pMOS transistors of the digital logic circuitry 42 may be supported in a p-type doped substrate 100 using the well-known triple well process as shown by the cross-section of FIG. 7. The pMOS transistor 44 is formed in an n-well 126 supported within the substrate 100. The n-well 126 provides the body of the pMOS transistor 44 which is reverse body biased by the positive PV circuit 52 with the reverse body bias voltage Vdds. An n-type more highly doped contact region 146 is provided in the n-well 126 for applying the reverse body bias voltage Vdds to the body of the pMOS transistor 44. The pMOS transistor 44 includes source and drain regions 142 of p-type conductivity that are provided in the n-well 126. The source and drain regions 142 are separated by a channel region (of well 126) and an insulated gate 144 is provided over the channel region. The nMOS transistor 46 is formed in a p-well 122 supported within the n-well 126. The p-well 122 is laterally isolated from the n-well 126 using a shallow trench isolation 128. The p-well 122 provides the body of the nMOS transistor 46 which is reverse body biased by the negative PV circuit 54 with the reverse body bias voltage Gnds. A p-type more highly doped contact region 136 is provided in the p-well 122 for applying the reverse body bias voltage Gnds to the body of the nMOS transistor 46. The nMOS transistor 46 includes source and drain regions 132 of n-type conductivity that are provided in the p-well 122. The source and drain regions 132 are separated by a channel region (of well 122) and an insulated gate 134 is provided over the channel region.

Figure 8A:
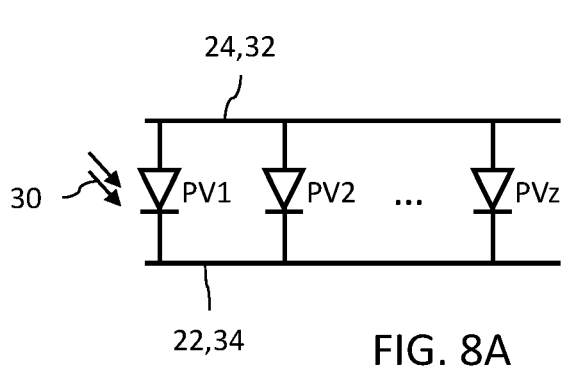
FIGS. 8A-8B show circuit implementations for photovoltaic circuits.
Figure 8B:
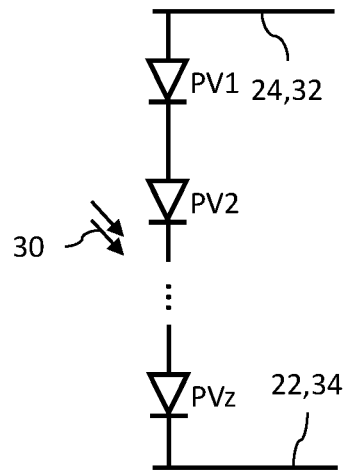

Each PV circuit 52, 54 may be formed by a plurality of photovoltaic cells PV1-PVz that are electrically connected in parallel, as shown in FIG. 8A. Alternatively, each PV circuit 52, 54 may be formed by a plurality of photovoltaic cells PV1-PVz that are electrically connected in series, as shown in FIG. 8B. Furthermore, each PV circuit 52, 54 may be formed by a plurality of photovoltaic cells PV1-PVz that are electrically connected in a circuit network including both parallel and serial connections of diodes. The choice for the electrical interconnection of the plurality of photovoltaic cells PV1-PVz is made by the circuit designer in accordance with the desired magnitude of voltage and current drive needed to be generated by the PV circuit 52, 54 for reverse body biasing of the transistors of the digital circuit.

It will be understood that the voltage and current drive is dependent of the illumination provided by the received photons 30. In this context, the illumination is an ambient illumination, for example, for the scene being imaged by the imaging circuit 80 or the environment in which the PV circuitry 50 is exposed. Variation in ambient light levels will change the magnitude of both the voltage and current generated by the PV circuitry 50. The generated voltage will increase proportional to the log of the light level and at all light levels are considered suited to providing the RBB voltage. The leakage current reduction and power savings achieved will vary with the light level, but will be present at all light levels.

Figure 9:
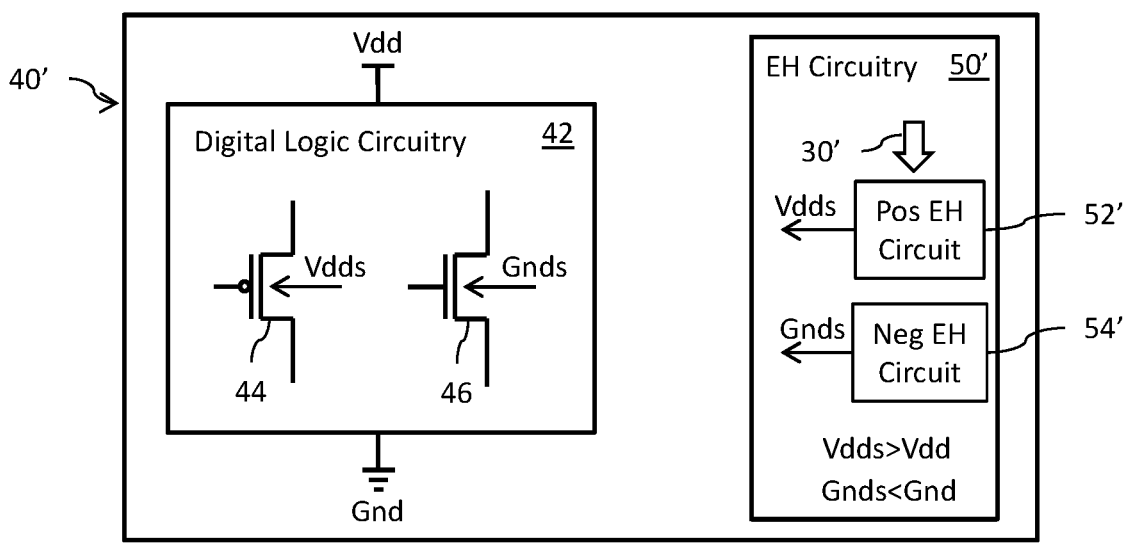
FIG. 9 is a block diagram for a digital circuit with reverse body biasing of transistor wells using energy harvesting circuits.

Although the embodiments discussed above concern generation of the reverse body bias voltages using a photovoltaic circuit, it will be noted that other forms of energy harvesting from the environment could instead be used in suitable situations. For example, in operational scenarios where the integrated circuit is not exposed to ambient light, the photovoltaic solution is inoperable. However, if other energy sources were available in that operational scenario, then a different form of energy harvesting could instead be used. Energy sources such a thermal energy or vibrational energy could be harvested by suitable energy harvesting (EH) circuits as known to those skilled in the art to generate the needed reverse body bias voltages. Such an implementation is shown in FIG. 9 where like reference numbers refer to like components as shown in FIG. 3 and previously described herein.

The integrated circuit device 40' includes energy harvesting (EH) circuitry 50' with a positive EH circuit 52' that responds to received energy 30' (such as thermal energy or vibrational energy) to generate a reverse body bias voltage Vdds (where Vdds>Vdd) for application to the wells of the pMOS transistors 44 within the digital logic circuitry 42. The energy harvesting (EH) circuitry 50' further includes a negative EH circuit 54' that responds to received energy 30' to generate a reverse body bias voltage Gnds (where Gnds<Gnd) for application to the wells of the nMOS transistors 46 within the digital logic circuitry 42. It will be noted that the EH circuitry 50' may be formed by a combination of harvesting circuits. As an example, photovoltaic harvesting in combination with one or more of thermal or vibrational harvesting circuits may be used. An advantage of the photovoltaic harvesting is that the required circuits are compatible with standard CMOS technology and can be supported on a common die.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
    a metal oxide semiconductor (MOS) transistor having a source terminal, a drain terminal, a gate terminal and a body terminal;
    wherein the source terminal is connected to receive a supply voltage;
    a photovoltaic circuit having a first terminal connected to the source terminal of the MOS transistor and a second terminal connected to the body terminal of the MOS transistor, wherein the photovoltaic circuit converts received photons to generate a reverse body bias voltage applied to the body terminal of the MOS transistor to increase a threshold voltage of the MOS transistor; and an imaging circuit including an array of pixels, with first pixels of the array forming an array of photodetectors and with second pixels of the array forming the photovoltaic circuit.

2. The circuit of claim 1, wherein the MOS transistor is a p-channel transistor, the supply voltage is a positive voltage Vdd and the reverse body bias voltage is a more positive voltage Vdds>Vdd.

3. The circuit of claim 2, wherein the p-channel MOS transistor is a circuit component of a digital logic gate.

4. The circuit of claim 1, wherein the MOS transistor is an n-channel transistor, the supply voltage is a ground voltage Gnd and the reverse body bias voltage is a more negative voltage Gnds<Gnd.

5. The circuit of claim 4, wherein the n-channel MOS transistor is a circuit component of a digital logic gate.

6. The circuit of claim 1, wherein the photovoltaic circuit comprises a photovoltaic diode, where the first terminal is a cathode of the photovoltaic diode and the second terminal is an anode of the photovoltaic diode.

7. The circuit of claim 1, wherein the photovoltaic circuit comprises a photovoltaic diode, where the first terminal is an anode of the photovoltaic diode and the second terminal is a cathode of the photovoltaic diode.

8. The circuit of claim 1, wherein the photovoltaic circuit comprises a plurality of photovoltaic diodes electrically connected in a circuit network, where the first terminal is a cathode of at least one of the plurality of photovoltaic diodes and the second terminal is an anode of at least one of the photovoltaic diodes.

9. The circuit of claim 8, wherein the circuit network is a parallel electrical connection of the plurality of photovoltaic diodes.

10. The circuit of claim 8, wherein the circuit network is a series electrical connection of the plurality of photovoltaic diodes.

11. The circuit of claim 1, wherein the photovoltaic circuit comprises a plurality of photovoltaic diodes electrically connected in a circuit network, where the first terminal is an anode of at least one of the plurality of photovoltaic diodes and the second terminal is a cathode of at least one of the photovoltaic diodes.

12. The circuit of claim 11, wherein the circuit network is a parallel electrical connection of the plurality of photovoltaic diodes.

13. The circuit of claim 11, wherein the circuit network is a series electrical connection of the plurality of photovoltaic diodes.

14. The circuit of claim 1, wherein the second pixels are arranged in a ring shape region surrounding the first pixels forming the array of photodetectors.

15. The circuit of claim 1, wherein each second pixel is formed by a photovoltaic diode, where the first terminal is a cathode of the photovoltaic diode and the second terminal is an anode of the photovoltaic diode.

16. The circuit of claim 1, wherein each second pixel is formed by a photovoltaic diode, where the first terminal is an anode of the photovoltaic diode and the second terminal is a cathode of the photovoltaic diode.

17. The circuit of claim 1, implemented as an imaging integrated circuit.

18. The circuit of claim 1, implemented as an integrated circuit.

* * * * *